US012765098B2

(12) United States Patent
Ko

(10) Patent No.: US 12,765,098 B2
(45) Date of Patent: Oct. 13, 2026

(54) IMAGE SENSOR MODULE ASSEMBLY DEVICE AND ASSEMBLY METHOD FOR THE SAME

(71) Applicant: SAMSUNG ELECTRONICS CO., LTD., Suwon-si (KR)

(72) Inventor: Ha Young Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/655,971

(22) Filed: May 6, 2024

(65) Prior Publication Data

US 2025/0031470 A1 Jan. 23, 2025

(30) Foreign Application Priority Data

Jul. 18, 2023 (KR) ........................ 10-2023-0092794

(51) Int. Cl.
*H10F 39/00* (2025.01)
*H04N 25/69* (2023.01)

(52) U.S. Cl.
CPC ......... *H10F 39/8063* (2025.01); *H04N 25/69* (2023.01); *H10F 39/802* (2025.01)

(58) Field of Classification Search
CPC .. H10F 39/8063; H10F 39/802; H10F 39/018; H10F 39/806; H04N 25/69; H04N 25/11; H04N 17/002; H04N 2201/0001; H04N 2201/0003; H04N 2201/0005; H04N 1/00045; G06T 7/80
USPC .................................................. 348/187, 188
See application file for complete search history.

(56) References Cited

U.S. PATENT DOCUMENTS

| | | | | |
|---|---|---|---|---|
| 7,332,712 B2 | 2/2008 | Webster | | |
| 10,293,441 B2 | 5/2019 | Kang | | |
| 10,353,167 B2 | 7/2019 | Wang et al. | | |
| 10,371,954 B2 | 8/2019 | Perez Calero et al. | | |
| 10,606,020 B2 | 3/2020 | Wei | | |
| 10,996,422 B2 | 5/2021 | Wang et al. | | |
| 11,460,713 B2 | 10/2022 | Au et al. | | |
| 2008/0074507 A1* | 3/2008 | Ohara | H04N 17/002 348/222.1 | |
| 2011/0007969 A1* | 1/2011 | Park | H04N 25/61 382/167 | |
| 2015/0062422 A1 | 3/2015 | Stern | | |
| 2016/0356978 A1* | 12/2016 | Osborne | G02B 7/025 | |
| 2017/0201744 A1* | 7/2017 | Wong | G06T 7/80 | |
| 2022/0270291 A1* | 8/2022 | Nguyen | H04N 25/61 | |
| 2024/0329381 A1* | 10/2024 | Ja | G02B 21/362 | |
| 2025/0045873 A1* | 2/2025 | Kundu | H04N 5/2226 | |

* cited by examiner

*Primary Examiner* — Albert H Cutler
(74) *Attorney, Agent, or Firm* — Sughrue Mion, PLLC

(57) ABSTRACT

An assembly method of an image sensor module assembly device is provided. The assembly method includes: setting an image sensor and a module lens of an image sensor module at a first position; inputting image data to the image sensor module set at the first position; pre-processing data that are output from the image sensor module based on sensing the input image data; obtaining, based on the pre-processed data, a module optical system reference value of the module lens and a sensor optical system reference value of the image sensor; and determining whether to maintain the first position based on the module optical system reference value and the sensor optical system reference value.

20 Claims, 10 Drawing Sheets

NxN UNIT AVERAGE VALUE CALCULATION

PSEUDO BW CALCULATION

IMAGE SENSOR MODULE ASSEMBLY DEVICE AND ASSEMBLY METHOD FOR THE SAME

CROSS-REFERENCE TO RELATED APPLICATION

This application claims priority from Korean Patent Application No. 10-2023-0092794 filed on Jul. 18, 2023 in the Korean Intellectual Property Office, the contents of which is incorporated by reference herein in its entirety.

BACKGROUND

1. Field

The disclosure relates to an image sensor module assembly device and an assembly method for the same.

2. Description of the Related Art

An image sensor tends to be developed as a fine pixel structure to provide a high resolution in consideration of a limited form factor of a mobile device. For the whole pixel array, each of the pixels needs to maintain the same or similar sensitivity under the same optical conditions. However, as the pixels become finer, and a unit pixel size of N×N becomes larger, pixels in a sensor periphery show a large sensitivity difference, which causes a deterioration in image quality.

Due to the physical limit in the amount of light that may be received per micro-pixel, extended Bayer color filter arrays or color filter arrays having pixel structures of different forms depending on the positions even for the same color have been developed. In addition, a sensitivity difference may occur between same color pixels due to a sensor optical system of an image sensor. Such sensitivity difference may be calibrated after the module optical system is installed and assembled, and a signal compensation may be performed at an image signal processing step. However, according to this method, it is also necessary to compensate for a sensitivity difference that increases due to the module optical system depending on the position of the module lens, by acquiring information on the sensitivity difference after determining the influences of the sensor optical system and the module optical system.

If a certain level of image quality is not guaranteed even if the sensitivity difference in the module optical system is compensated for, the entire image sensor module to which the image sensor is mounted is determined to be defective, and the defective image sensor module is discarded after its assembly. As such, there is a problem of an increase in cost.

SUMMARY

Aspects of the disclosure provide an image sensor module assembly device and an assembly method thereof that may detect optimal positions of a module optical system and a sensor optical system.

Aspects of the disclosure also provide an image sensor module assembly device and an assembly method thereof that may assemble a module lens at a position where elements influenced by a sensor optical system and a module optical system are minimized or optimized when mounting the module lens to improve a process yield of a sensor module.

One embodiment of the disclosure provides an assembly method of an image sensor module assembly device, the method including: setting an image sensor and a module lens of an image sensor module at a first position; inputting image data to the image sensor module set at the first position; pre-processing data that are output from the image sensor module based on sensing the input image data; obtaining, based on the pre-processed data, a module optical system reference value of the module lens and a sensor optical system reference value of the image sensor; and determining whether to maintain the first position based on the module optical system reference value and the sensor optical system reference value.

Another embodiment of the disclosure provides an image sensor module assembly device including: a device setting unit configured to assemble an image sensor module by setting an image sensor and a module lens at a first position and mounting the image sensor and the module lens, set at the first position, to a module body; and a test module configured to input image data to the image sensor module; obtain, based on data output from the image sensor module based on sensing the input image data, a module optical system reference value and a sensor optical system reference value; and determine whether to maintain the first position based on comparing each of the module optical system reference value and the sensor optical system reference value with a corresponding preset threshold range.

Other embodiment of the disclosure provides an image sensor module assembly device including at least one processor configured to: set an image sensor and a module lens at a first position and control to mount the image sensor and the module lens to a module body to firstly assemble an image sensor module; input image data to the firstly assembled image sensor module; pre-process data that are output from the image sensor module based on sensing the input image data; obtain, based on the pre-processed data, a module optical system reference value and a sensor optical system reference value; compare each of the module optical system reference value and the sensor optical system reference value with a corresponding preset threshold range; and set the image sensor and the module lens at a second position to secondly assembly the image sensor module depending on a comparison result.

However, aspects of the disclosure are not restricted to the one set forth herein. The above and other aspects of the disclosure will become more apparent to one of ordinary skill in the art to which the disclosure pertains by referencing the detailed description of the disclosure given below.

BRIEF DESCRIPTION OF DRAWINGS

The above and other aspects, features, and advantages of certain embodiments of the disclosure will be more apparent from the following description taken in conjunction with the accompanying drawings.

DETAILED DESCRIPTION

Figure 1:
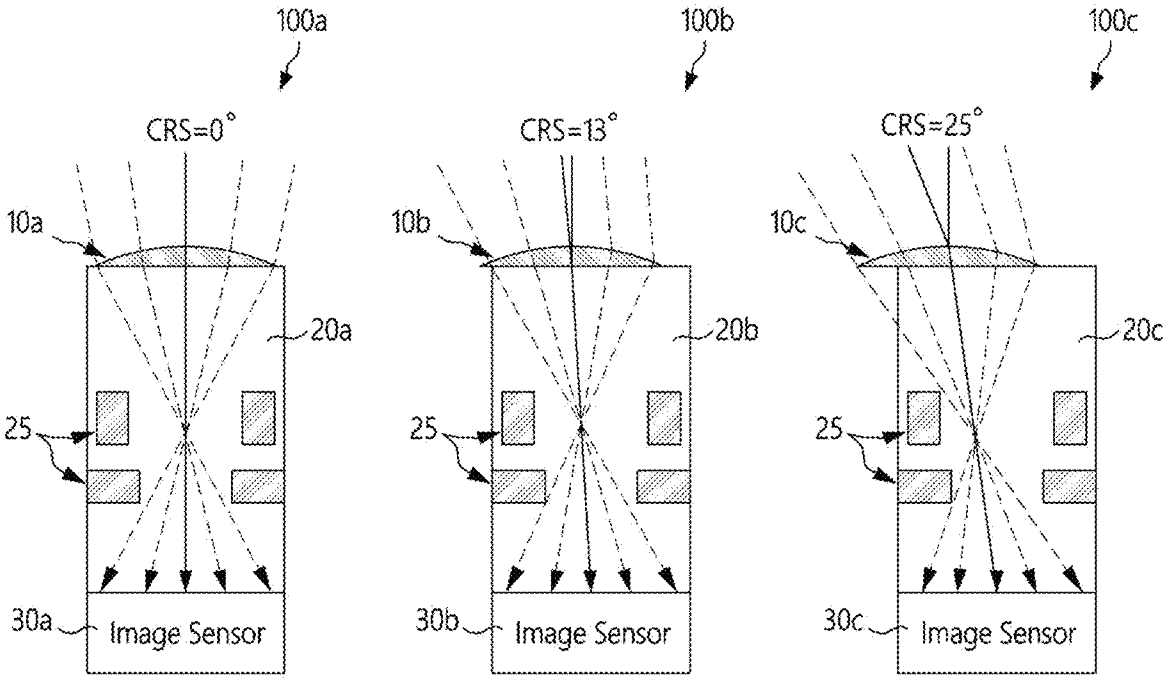
FIG. 1 is a diagram for explaining changes in incident light and differences in pixel sensitivity depending on a position of a module lens.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects of the disclosure. Expressions such as "at least one of," when preceding a list of elements, modify the entire list of elements and do not modify the individual elements of the list.

An image sensor module assembly device and an assembly method thereof according to some embodiments of the disclosure will be described below with reference to FIGS. 1 to 10.

FIG. 1 is a diagram for explaining changes in incident light and differences in a pixel sensitivity depending on a position of a module lens.

Referring to FIG. 1, image sensor modules 100*a*, 100*b*, and 100*c* respectively include module lens 10*a*, 10*b*, and 10*c*, connecting parts 20*a*, 20*b*, and 20*c*, and image sensors 30*a*, 30*b*, and 30*c*. The module lens 10*a*, 10*b*, or 10*c* may collect incident light that enters from the outside. The connecting part 20*a*, 20*b*, or 20*c* connects the module lens 10*a*, 10*b*, or 10*c* and the image sensor 30*a*, 30*b*, or 30*cc*, and includes a metal trace 25. The metal trace 25 concentrates the incident light and transfers the concentrated light to the image sensor 30*a*, 30*b*, or 30*c*, while blocking the scattered light of the incident light that is refracted and incident from the module lens 10*a*, 10*b*, or 10*c*.

Among the incident lights, when an incident angle (chief ray angle) of a chief ray in the incident light passing through the center of the module lens 10*a* is 0° (CRS=0°), the chief ray is perpendicularly incident on an upper face of the image sensor 30*a*. However, the incidence angle of the incident light increases toward the periphery of the image sensor 30*a*, and as the incidence angle increases, a sensitivity difference depending on the pixel position of the image sensor 30*a* increases. However, if the incidence angle of the chief ray is 0°, the center of the pixel array and a central axis of the module lens almost match with each other, and therefore, even if the sensitivity difference between pixels increases toward the periphery from the center of the pixel array, the sensitivity difference is symmetrical relative to the center of the pixel array. Thus, the sensitivity difference may be solved to some extent by a signal calibration.

However, if the module lens 10*a* is distortedly assembled without coinciding with the center of the image sensor 30*a*, that is, if the incidence angle CRS of the chief ray is not 0°, it becomes difficult to solve the pixel sensitivity difference in the pixel array by the signal calibration.

For example, in the image sensor modules 100*b* and 100*c*, when the module lens 10*b* or 10*c* is assembled by shifting to one side (e.g., to a left side in the shown examples), the central axis of the module lens 10*b* or 10*c* does not match with the center of the pixel array, and the incidence angle of the incident light on the pixel array varies on both left and right sides of the pixel array. For example, an optical path of left incident light in a shift direction (that is, left direction), in which the module lens 10*b* or 10*c* has been shifted, becomes relatively longer than an optical path of right incident light in an opposite direction (that is, right direction), and the sensitivity difference between pixels in the pixel array further increases, compared to the image sensor module 100*a*. When comparing the optical path of the incident light in the image sensor module 100*b* with the optical path of the incident light in the image sensor module 100*c*, the degree of shift of the module lens 10*c* is large than the module lens 10*b*. Therefore, in the image sensor 100*c*, the degree of asymmetry of the optical path increases, and the sensitivity difference between the pixels caused by crosstalk also increases due to the asymmetry of the optical path. Although not shown, the optical path becomes asymmetric not only when the position of the module lens is shifted horizontally but also when it is tilted vertically and horizontally, and the sensitivity difference depending on the position of the pixel array may increase. In the case of a micro-pixel structure, a process or calibration for compensating for the pixel sensitivity differences due to a module lens needs to be additionally considered. However, as the pixels become finer to implement higher resolution, the process difficulty and the accuracy variance in performing such calibration increase.

Therefore, according to an example embodiment, the optimal position for the module lens and the image sensor is determined to minimize the influence of physical pixel sensitivity differences, prior to assembly of the image sensor module. Accordingly, yield of the image sensor modules may be improved, while increasing the resolution of the image being sensed.

Figure 2:
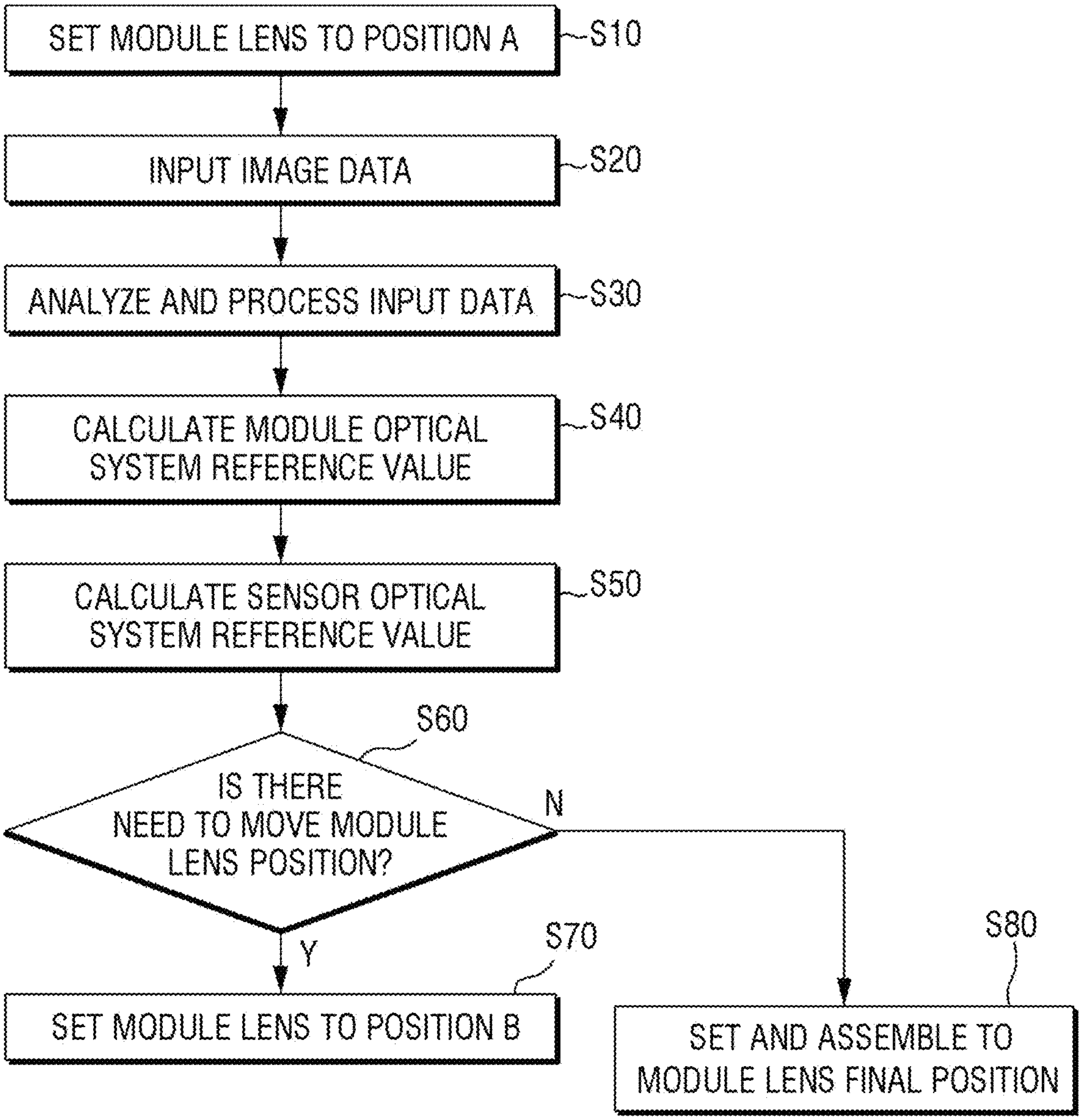
FIG. 2 is a flowchart for explaining a method for assembling an image sensor module in an image sensor module assembly device of the disclosure according to some embodiments.
Figure 3:
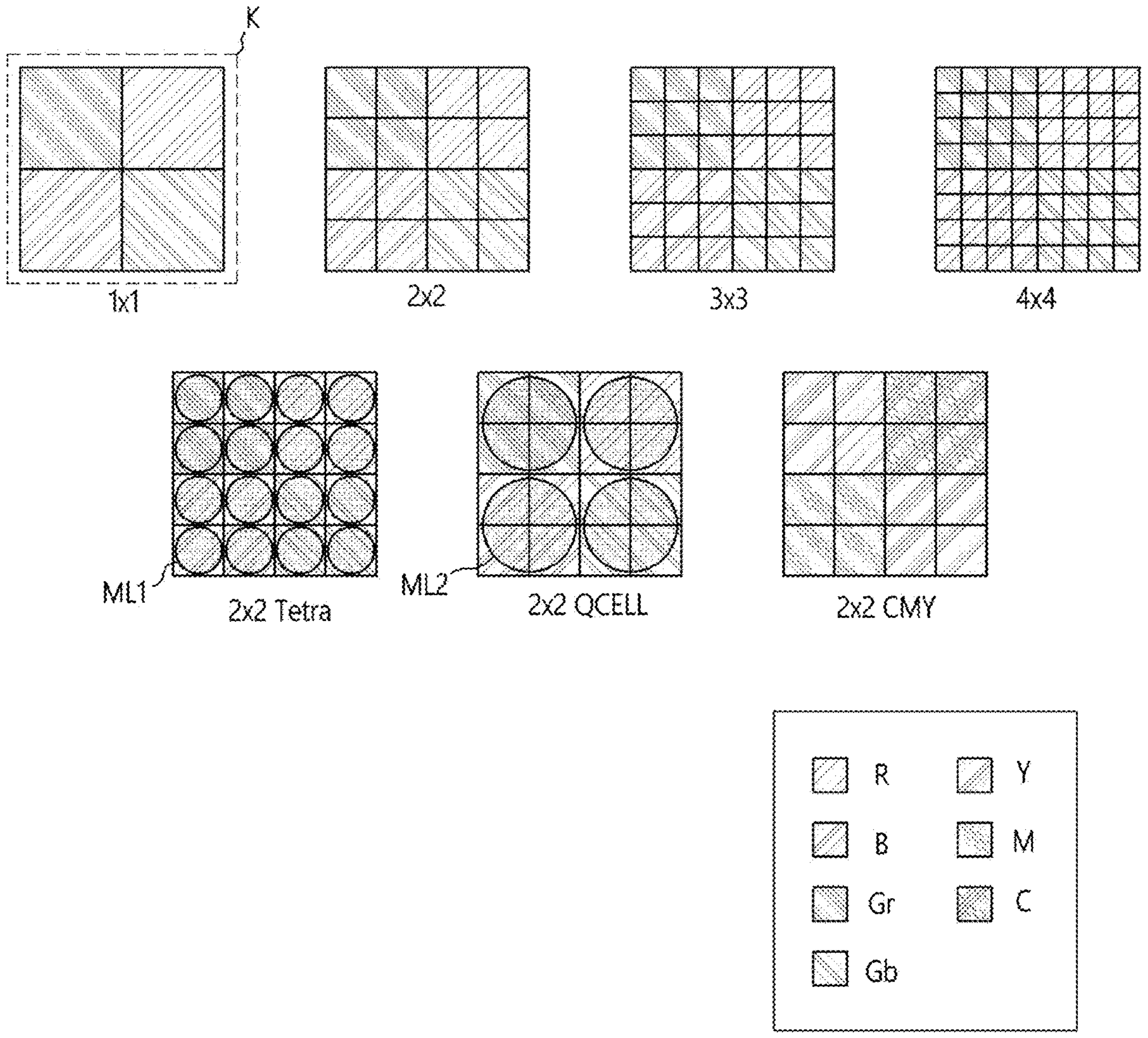
FIG. 3 is a flowchart for explaining a unit pixel structure of input data according to some embodiments.
Figure 4:
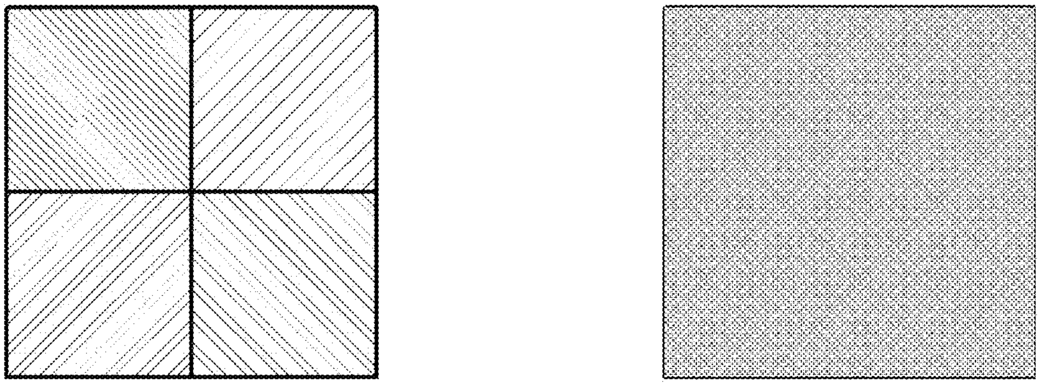
FIGS. 4 and 5 are diagrams for explaining pre-processed input data according to some embodiments.
Figure 5:
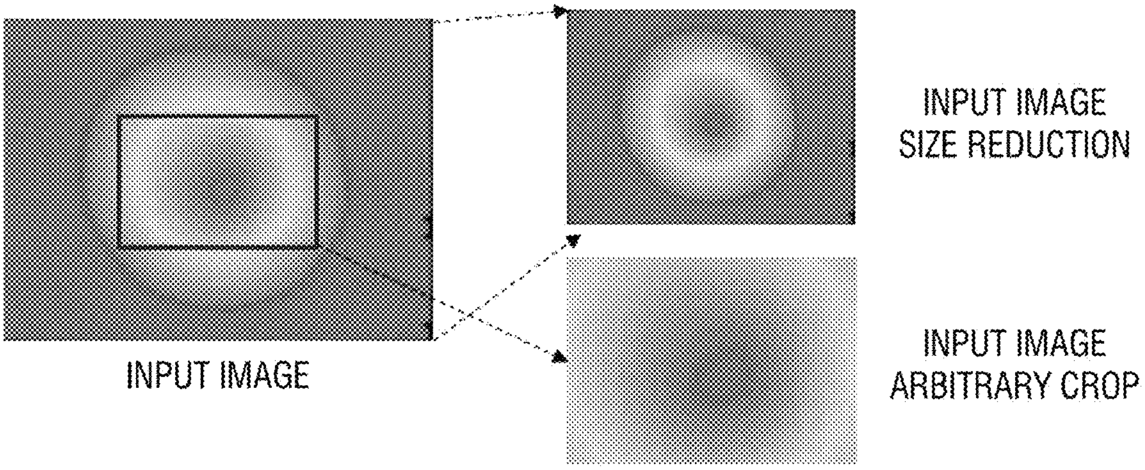
Figure 6:
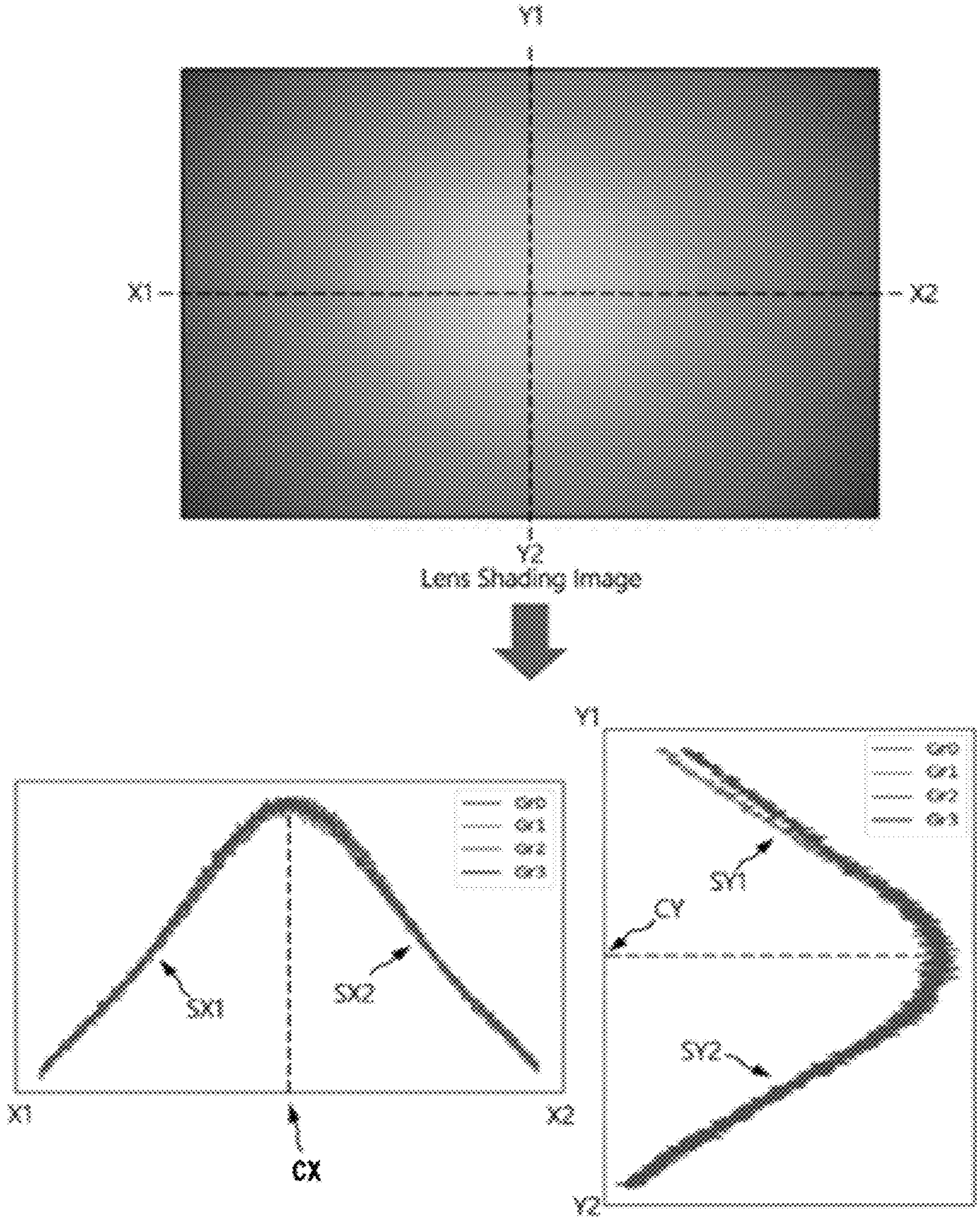
FIG. 6 is a diagram for explaining analysis of input data according to some embodiments.
Figure 7:
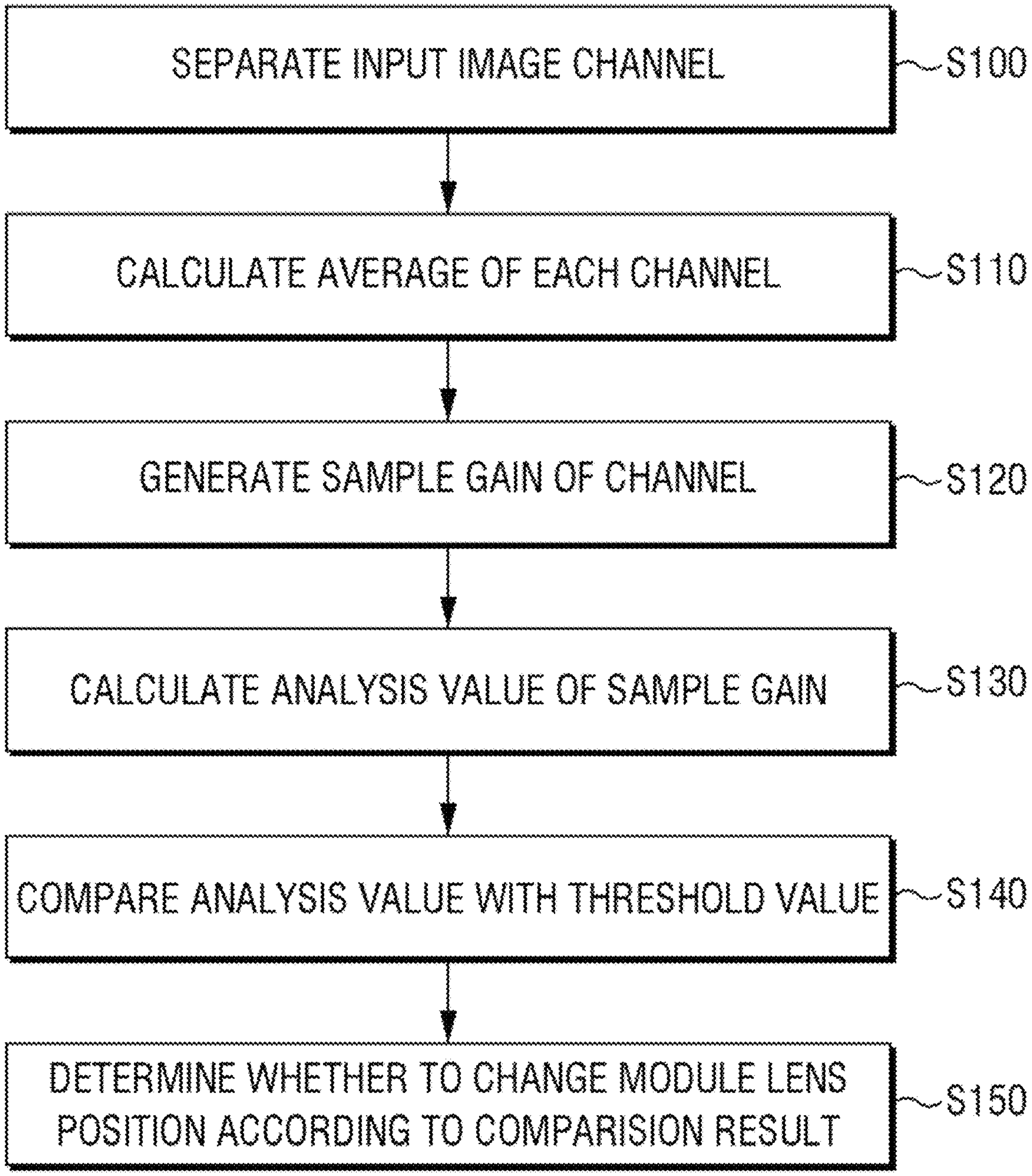
FIG. 7 is a flowchart for explaining a sensor optical system reference value according to some embodiments.
Figure 8:
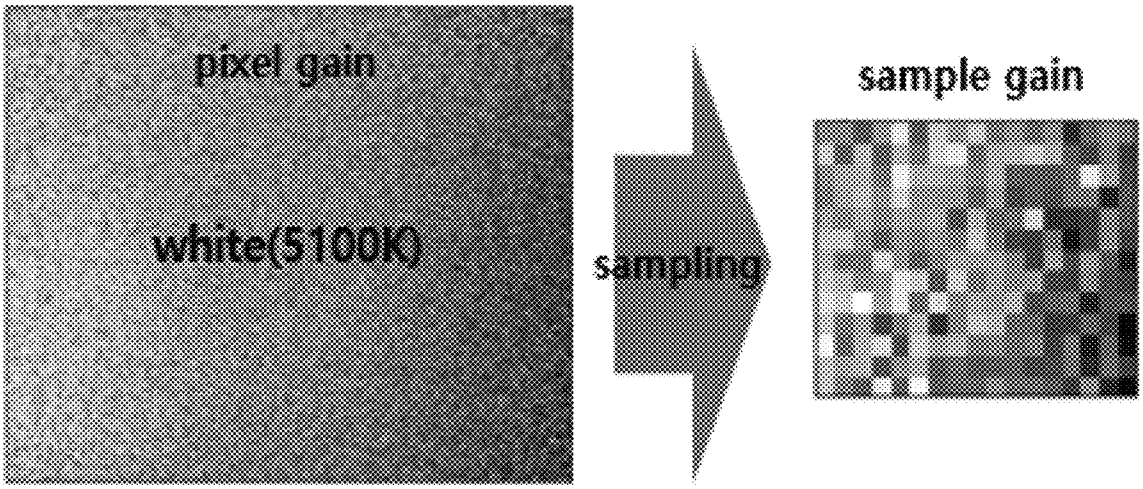
FIGS. 8 and 9 are diagrams for explaining calculation of a sensor optical system reference value according to some embodiments.
Figure 9:
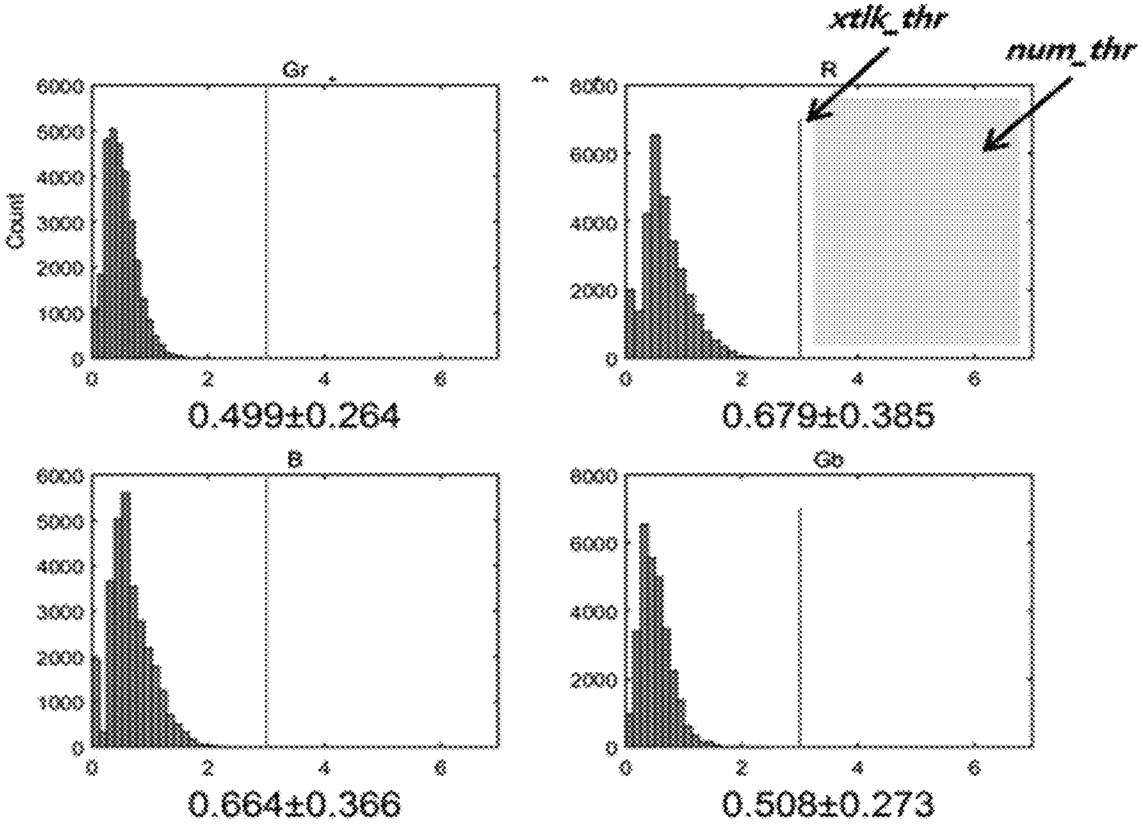

FIG. 2 is a flowchart for explaining a method for assembling an image sensor module in an image sensor module assembly device of the disclosure according to some embodiments. FIG. 3 is a flowchart for explaining a unit pixel structure of input data according to some embodiments. FIGS. 4 and 5 are diagrams for explaining preprocessed input data according to some embodiments. FIG. 6 is a diagram for explaining analysis of input data according to some embodiments. FIG. 7 is a flowchart for explaining a sensor optical system reference value according to some embodiments. FIGS. 8 and 9 are diagrams for explaining calculation of the sensor optical system reference value according to some embodiments.

Referring to FIG. 2, the image sensor module assembly device sets the image sensor and the module lens to a position A (S10). The position A may be, for example, an initial position that is set to the image sensor module assembly device. For example, the position A is set with regards to a relationship between a top face of the image sensor, a lens plane of the module lens, a lens central axis, etc., and may include a vertical position, a horizontal position, and an inclined angle of a lens face.

The image sensor module assembly device inputs image data for testing to the image sensor module in which the module lens is set at the position A (S20). The input image data may not be an image including a subject having a specific shape, but may be an image captured under a certain optical condition without a subject. The optical condition may be light that exhibits a certain fixed color depending on the setting, or may be light that exhibits at least two colors that change at a predetermined cycle.

The image sensor module assembly device analyzes and pre-processes the input data sensed by the image sensor module (S30).

Input data (or input image) may be expressed by using a pixel array including unit pixels of various patterns depending on the pattern of the color filter array of the image sensor. Although the pixel array including unit pixels is described, the unit pixel may be referred to as different terms such as a unit kernel, a unit window, or the like according to various embodiments.

The pixel array may be placed in a Bayer pattern according to some embodiments. The Bayer pattern includes a column in which R (red) sub-pixels and Gr (green) sub-pixels are repeatedly placed, and a column in which Gb (green) sub-pixels and B (blue) sub-pixels are repeatedly placed. Referring to FIG. 3, the Bayer pattern may include a plurality of R (red) sub-pixels, a plurality of B (blue) sub-pixels, and a plurality of Gr and Gb (green) sub-pixels in one unit pixel group. That is, color sub-pixels of each color may have an array form in a 2×2 array, a 3×3 array, or the like. Thus, a unit pixel K may be implemented in various patterns as shown in FIG. 3.

According to some embodiments, the unit pixel may refer to a smallest color pattern unit in which same color sub-pixels in the form of an N×N array (N is a natural number equal to or greater than 1) are placed in a Bayer pattern. As an example, the unit pixel K may be implemented in a 1×1 pattern including one R (red) sub-pixel, one Gr (green) sub-pixel, one Gb (green) sub-pixel, one B (blue) sub-pixel. As an example, the unit pixel K may be implemented in a 2×2 pattern including four R (Red) pixels, four Gr, Gb (green) pixels, and four B (blue) pixels. As an example, the unit pixel K may be implemented in a 3×3 pattern including nine R (red) sub-pixels, nine Gr (green) sub-pixels, nine Gb (green) sub-pixels, and nine B (blue) sub-pixels. As an example, the unit pixel K may be implemented in a 4×4 pattern including sixteen R (red) sub-pixels, sixteen Gr (green) sub-pixels, sixteen Gb (green) sub-pixels, and sixteen B (blue) sub-pixels. Further, although not shown, array sizes of the same color pixels such as 5×5 and 6×6 may be implemented in various sizes depending on the degree of pixel miniaturization process.

Alternatively, according to some embodiments, the unit pixel refers to a smallest color pattern unit in which the same color sub-pixels in the form of an N×N array (Nis a natural number equal to or greater than 1) are placed in a Bayer pattern and a microlense matches thereto. That is, the unit pixel may be implemented in various ways depending on the matching ratio and placement form of the microlens and the sub-pixel.

As an example, the unit pixels K may be implemented differently even in the N×N pattern depending on the matching ratio between the pixel array of the image sensor and the microlens included in the image sensor. As an example, referring to FIG. 3, even if same color sub-pixels are arranged in a 2×2 array, depending on whether one microlens ML1 is arranged to correspond to one sub-pixel (Tetra), or whether when one microlens ML2 is arranged to correspond to four sub-pixels (Qcell), there is a difference in an amount of incident light that enters through the microlens in the module lens. Thus, the unit pixel is divided into various unit pixels according to different embodiments. For example, although not shown, when one microlens matches at least two sub-color pixels, it is considered to correspond to a unit pixel described in the example embodiment of the disclosure.

Alternatively, according to some embodiments, the sub-pixel colors of the Bayer pattern constituting the unit pixel are implemented as C (cyan), M (magenta), and Y (yellow) colors instead of R, G, and B colors.

The image sensor module assembly device may generate pre-processed input data by pre-processing the input data in S30 according to the form of the input data. The pre-processed input data may be images that are intentionally processed to determine pixel sensitivity differences influenced by the module optical system and the sensor optical system.

According to some embodiments, the image sensor module assembly device may process the unit pixels of the N×N array pattern as shown in FIG. 3 in the manner described as shown in FIG. 4 or FIG. 5.

Referring to FIG. 4, the image sensor module assembly device may perform the color filter array pre-processing on the input data. Specifically, as an example, the image sensor module assembly device may generate pre-processed input data obtained by calculating a value of the unit pixel based on a pixel average value of same color sub-pixels included in an N×N array, as shown in a left diagram of FIG. 4. Alternatively, the image sensor module assembly device may generate pre-processed input data based on a pixel minimum value or a pixel maximum value among the same color sub-pixels of the N×N array according to various embodiments. That is, a representative pixel value (e.g., a pixel average value) is calculated for each sub-pixel of each color from the unit pixel of the N×N (N is an integer equal to or greater than 2) array pattern, and the pre-processed unit data including the pre-processed unit pixels of a 2×2 array pattern in which the calculated representative pixel value is mapped for each color is output.

Alternatively, as shown in a right diagram of FIG. 4 as an example, a pre-processed input image may be generated in which the unit pixel of the N×N array is processed with a pseudo color value, for example, a pseudo black and white value (Pseudo BW), regardless of color. For example, when the input image has RGB colors, the pseudo color value may be an average value of R, G, and B color pixel values. Alternatively, although not shown, as an example, the image sensor module assembly device may sort the sub-pixels of the same position for each same sub-color pixel or in an N×N array. That is, one pseudo color value is calculated for each of all color sub-pixels in the unit pixel of the N×N (N is an integer of 2 or more) array pattern, and the pre-processed input data including the pre-processed unit pixel to which the calculated pseudo color value is mapped for each color is output.

In order to enhance the processing speed, as shown in FIG. 5, the image sensor module assembly device may, for example, generate pre-processed input data in which the size of the input data is adjusted (for example, reduced) to a preset ratio. Or, as an example, the image sensor module assembly device may generate the pre-processed input data obtained by cropping an arbitrary window region of the input data that is sensitive to a pixel sensitivity difference.

The image sensor module assembly device calculates a reference value for the module optical system from the pre-processed input data (S40 of FIG. 2).

The reference value for the modular optical system refers to a value for expressing a number of factors or features that affect the image quality of an image sensed by an image sensor due to the influence of the module lens. In other words, the reference value may be a value that expresses spatial position-specific features of the pre-processed input data. For example, the reference value for the module optical system may include a value of an optical axis, a lens shading value, an image asymmetry (tilt) value, or the like of the pre-processed input data that changes depending on the position of the module lens. For example, the reference value for the module optical system may be a value of an optical axis, a lens shading value, or an image asymmetry (tilt) value that is not correlated with a color. As another example, the reference value may be a value of an optical axis, a lens shading value, or an image asymmetry (tilt) value of a particular color.

Referring to FIG. 6, as an example, the pre-processed input image may be an image expressed by the lens shading value. The image sensor module assembly device may determine whether the currently set position of the module lens is appropriate by using the module optical system reference value of the pre-processed input image.

For example, the image sensor module assembly device may calculate a reference value of the lens shading by applying a preset gain to an input image that is pre-processed to produce an intentional color fringe.

For example, referring to FIG. 6, the image sensor module assembly device may determine a center point of the optical axis of the current module lens, based on the pixel value dispersion of a particular color, in a two-dimensional graph distributed along an X-axis of a line X1-X2 or a Y-axis of a line Y1-Y2 in the pre-processed input image. For example, an optical center point of the pixel value dispersion along the X-axis of the line X1-X2 may be determined to be a point CX, and an optical center point of the pixel value dispersion along the Y-axis of the line Y1-Y2 may be determined to be a point CY. The image sensor module assembly device may generate a reference value expressing the lens shading in the X-direction or a reference value expressing an image asymmetry in the X-direction based on a pixel value dispersion of both sides SX1 and SX2, in accordance with the X-axis optical axis center point CX. The image sensor module assembly device may calculate a reference value expressing the lens shading in the Y-direction or a reference value expressing the image asymmetry in the Y-direction based on the pixel value dispersion on both sides SY1 and SY2, in accordance with the Y-axis optical center point CY.

While it is illustrated in FIG. 6 that the line X1-X2 and the line Y-Y2 are axes that cross the center of the input image, the disclosure is not limited thereto. For example, according to various embodiments, the X-axis of X1-X2 and the Y-axis of Y1-Y2 may be set at different positions depending on various patterns of the pre-processed input data (for example, when cropped) and a pixel value dispersion thereof may be represented in a two-dimensional graph. Further, the pixel value dispersion may also be represented in a three-dimensional graph by scanning the entire pre-processed input data in the X-axis and Y-axis.

The image sensor module assembly device calculates a reference value for the sensor optical system from the pre-processed input data (S50 of FIG. 2). The reference value for the sensor optical system may be a value that may indicate the pixel sensitivity difference and the optical image quality deterioration that occur in the image sensor.

For example, the reference value for the sensor optical system may be expressed using a gain calculated from the pixel value of pre-processed input data, a sensitivity difference between adjacent pixels (e.g., differential), an absolute value of the sensitivity difference, a gradient value between adjacent pixels, and the like.

Referring to FIG. 7, the image sensor module assembly device separates channels from the input data (S100) that is received in S20 and pre-processed in S31 in FIG. 2. For example, when the unit pixels have RGB colors of an N×N pattern, the unit pixels may be divided for each color.

The image sensor module assembly device calculates a monitoring value for each channel to check the pixel sensitivity difference of the sensor optical system. For example, the monitoring value may be determined for each color, based on at least one of an average value of same color sub-pixels, a normalized offset value, a pixel value change amount or a gain, and the monitoring value may be used as the reference value for the sensor optical system.

As an example, an average value of each channel pixel value is calculated for the input image according to each color channel (S110). The average value may be an average value of each color included in a unit pixel. For example, in a unit pixel structure of 2×2 pattern (that is, color sub-pixels of each color has a 2×2 array), the average value of each color may be calculated as the average value of four sub-pixels for each color unit pixel.

The image sensor module assembly device generates sample gains of the input image for each color channel (S120). For example, the sample gain may be calculated as in Formula 1.

$$G(C_n) = \frac{\frac{1}{M}\sum_{i=0}^{(M-1)} C_i}{C_n}$$

In Formula 1, for example, C denotes pixel values of R, B, Gr, and Gb color sub-pixels for each color channel, n is each index of a same color sub-pixel included in a unit pixel (for example, n is 0 to 3 in the 2×2 pattern), and M denotes a total number of same color sub-pixels included in the unit pixel (for example, M is 4 in the 2×2 pattern).

To explain the sample gain in more detail, calculation of the sample gain for a particular color (for example, a red color) in the input image captured under a white optical condition of 5100K is described with reference to FIG. 8. For the red color, a sample gain is calculated based on an average value $$\left(\frac{1}{M}\sum_{i=0}^{(M-1)} R_i\right)$$

calculated in S110 in FIG. 7 as a numerator, and a pixel value $R_i$ of the sub-pixel as a denominator, and a sample gain image for the red color is obtained in which the calculated sample gain for the red color is expressed as an image. Since the pixel sensitivity differs depending on the position of the unit pixel the sample gain image is obtained as in the right image of FIG. 8, in which the sample gain corresponding to the unit pixel position of the entire input image is expressed.

The image sensor module assembly device may calculate a monitoring value from the sample gain image (S130 in FIG. 7). For example, the monitoring value may include at least one of a minimum value, a maximum value, an average value, or the like of the sample gain for each channel included in the sample gain image.

The image sensor module assembly may calculate an analysis value for each channel from the monitoring value and the sample gain image, may compare the calculated analysis value with a preset threshold range or threshold value (S140 in FIG. 7), and may determine whether to maintain the currently set position A depending on the comparison result (S150 in FIG. 7). The preset threshold range or threshold value may not be set for a single numerical value only, but may be respectively set for a plurality of numerical values belonging to the module optical system reference value and the sensor optical system reference value.

To explain the analysis value by using an example of the sample gain image shown in FIG. 8, a density appears differently for each pixel depending on the sample gain, and by counting a number of pixels with the same sample gain, a histogram for each channel may be shown as in FIG. 9. In the histogram, the criterion for determining a good (or non-defective) product may be defined based on a threshold sample gain value (xtlk_thr). For example, a number (num_thr) of pixels that have a sample gain value greater than the threshold sample gain value, that is, the number (num_thr) of pixels having an outlier sample gain may be defined as the analysis value. For example, if the number of pixels having an abnormal value sample gain is equal to or greater than a preset threshold number, it may be determined that the currently set position A is not appropriate, and if the number (num_thr) of pixels having an abnormal value sample gain is less than the preset threshold number, it may be determined that the currently set position A is maintained.

Figure 10:
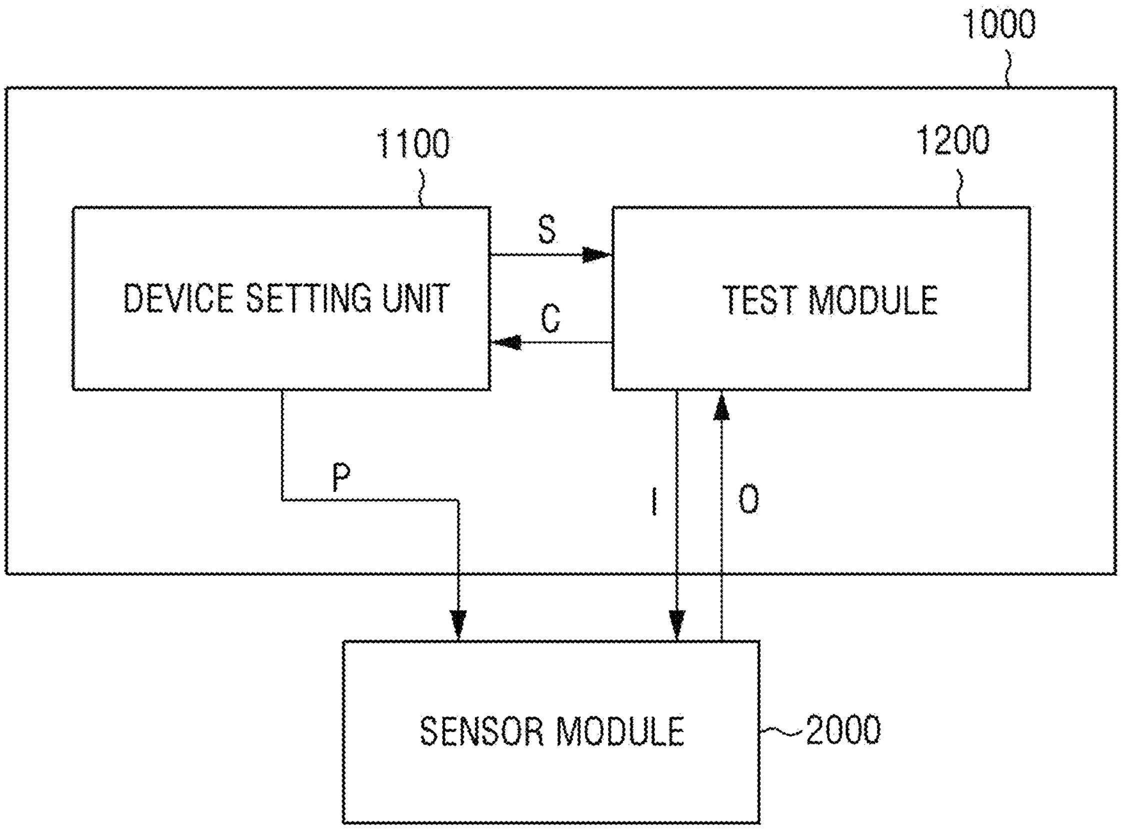
FIG. 10 is a block diagram for explaining an image sensor module assembly device according to some embodiments.

FIG. 10 is a block diagram for explaining an image sensor module assembly device according to some embodiments.

The image sensor module assembly device according to some embodiments is configured to perform a process of firstly assembling the image sensor module by setting the image sensor and the module lens at a first position and attaching the image sensor and the module lens to a module body, a process of inputting the image data to the first assembled image sensor module, a process of pre-processing the input data that is output from the image sensor module, a process of calculating the module optical system reference value and the sensor optical system reference value from the pre-processed input data, a process of comparing the calculated module optical system reference value and the sensor optical system reference value with the preset threshold range (or preset threshold value), and according to a result of comparison, a process of setting the image sensor and the module lens at a second position to secondarily assemble the image sensor module. In some embodiments, the image sensor module assembly device may perform the above processes after assembling the image sensor module based on the second position.

According to some embodiments, the image sensor module assembly device 1000 is connected to an image sensor module 2000, and includes a device setting unit 1100 and a test module 1200.

The device setting unit 1100 mounts the image sensor and the module lens to the module body at the set position. For example, the device setting unit 1100 mounts the image sensor and the module lens to a temporarily set initial position S, and transmits the currently set position S to the test module 1200. Thereafter, the device setting unit 1100 may adjust the positions of the image sensor and the module lens in the image sensor module 2000 according to a notification signal C of the test module 1200, and mount the image sensor and the module lens again based on the adjusted positions.

The test module 1200 inputs image data I to the image sensor module 2000 in which the image sensor and the module lens are temporarily mounted in the device setting unit 1100. The image sensor module 2000 senses the input image data I and outputs input data O. The test module 1200 receives the input data O, pre-processes the input data O, and calculates a module optical system reference value and a sensor optical system reference value from the pre-processed input data.

The input data O may include a unit pixel of an N×N (N is an integer of 2 or more) array pattern, and pre-processing of the input data O may include, as an example, a process of calculating the pixel average value of same color sub-pixels belonging to the unit pixel, and a process of outputting the pre-processed input data including the pre-processed unit pixels of the N×N (e.g., 2×2) array pattern to which the pixel average value is mapped for each color. Alternatively, as another example, the pre-processing of the input data O may include a process of calculating one pseudo color value for all color sub-pixels belonging to the unit pixel on the image data including the unit pixels of the N×N (N is an integer of 2 or more) array pattern, and a process of outputting the pre-processed input data including the pre-processed unit pixel to which the pseudo color value is mapped. At this time, in order to calculate the N×N (e.g., 2×2) array pattern or the pseudo color value of the pre-processed unit pixel, the input data may be the input data itself that is output from the image sensor module 2000 according to various embodiments, or the output input data reduced to a preset ratio, or data that is obtained by cropping a partial region of the output input data.

The test module 1200 may calculate the module optical system reference value from the pre-processed input data. The module optical system reference value is a value that changes according to the position of the module lens in the image sensor module 2000, and may be one of a value of the optical axis, a lens shading value, and an image asymmetry (tilt) value calculated from the pre-processed input data as explained in FIG. 6. The module optical system reference value may be calculated as previously explained in FIG. 6.

The test module 1200 may calculate the sensor optical system reference value from the pre-processed input data. The sensor optical system reference value is a value that changes according to the position of the image sensor in the image sensor module 2000, and may be at least one of a pixel average value for each channel, a pixel minimum value for each channel, a pixel maximum value for each channel, a sensitivity difference (e.g., differential) between adjacent pixels for each channel, an absolute value of the sensitivity difference, and a gradient value between adjacent pixels for each channel calculated from pre-processed input data. The sensor optical system reference value may be calculated as explained in the embodiment of FIGS. 7 to 9 described above.

The test module 1200 compares each of the calculated module optical system reference value and the sensor optical system reference value with a corresponding preset threshold range. As an example, preset threshold ranges may be stored for respective types of numerical values in a memory provided in the test module 1200. The preset threshold range may be a range in which the image sensor module 2000 may be discriminated as a good (or non-faulty) product, that is, a maximum value and a minimum value allowed for the numerical value are stored in a form of a mapping table, for each value including, for example, an optical axis, a lens shading value, an image asymmetry (tilt) value, a pixel average value for each channel, a pixel minimum value for each channel, a pixel maximum value for each channel, a sensitivity difference between adjacent pixels for each channel, an absolute value of the sensitivity difference, a gradient value between adjacent pixels for each channel, or the like. Further, as another example, the preset threshold range may be stored in consideration of a correlation between a first numerical value and a second numerical value. The first numerical value may be one of numerical values included in the module optical system reference value and the sensor optical system reference value, and the second numerical value may be a numerical value included in another module optical system reference value and another sensor optical system reference value that are different from the first numerical value.

The test module 1200 compares each of the calculated module optical system reference value and the sensor optical system reference value with a corresponding preset threshold range, and determines whether the currently set positions of the image sensor and the module lens are appropriate depending on the comparison results. If there is a value outside the corresponding preset threshold range among the module optical system reference value and the sensor optical system reference value (that is, at least one of the module optical system reference value and the sensor optical system reference value does not belong to the corresponding preset threshold range), the test module 1200 determines to change the currently set position(s) of the image sensor and the module lens.

The test module 1200 may output a notification signal C indicating that the currently set position(s) is not appropriate, according to an embodiment. Alternatively, according to another embodiment, information of a position to be changed is calculated based on the module optical system reference value and the sensor optical system reference value, and may be output to the device setting unit 1100, by including the calculated information of the position in the notification signal. The device setting unit 1100 outputs a control signal P for adjusting the positions of the image sensor and the module lens to the image sensor module 2000 according to the notification signal C.

For example, as in the test module 1200, the device setting unit 1100, and the image sensor module 2000, the term "unit" or "module" as used herein refers to a hardware component such as a software, a Field Programmable Gate Array (FPGA) or an Application Specific Integrated Circuit (ASIC), and the "unit" or "module" perform some roles. However, the meaning of the "unit" or "module" is not limited to software or hardware. The "unit" or "module" may be configured to be in an addressable storage medium and configured to recycle one or more processors. Thus, as an example, the "unit" or "module" includes components such as software components, object-oriented software components, class components, and task components, and processes, functions, attributes, procedures, subroutines, segments of program code, drivers, firmware, micro code, circuit, data, database, data structures, tables, arrays, and variables. The functionality provided within the components and "unit" or "module" may be combined into fewer components and "units" or "modules", or may be further separated into additional components and "units" or "modules".

The image sensor module assembly device and the assembly method thereof according to the embodiments of the disclosure may calculate in advance an optimal module position that minimizes a pixel sensitivity difference, which is caused due to combined influence of the sensor optical system and the module optical system on fine pixels, and assemble the image sensor module by using the calculated optimal module position. Accordingly, the resolution of the image sensor module may be improved, and also the yield of the image sensor modules may be improved, which reduces costs.

While example embodiments of the disclosure have been described above with reference to the accompanying drawings, the disclosure is not limited to the above embodiments, and may be fabricated in various forms. Those skilled in the art will appreciate that the disclosure may be embodied in other specific forms without changing the technical spirit or essential features of the disclosure. Accordingly, the above-described embodiments should be understood in all respects as illustrative and not restrictive.

What is claimed is:

1. An assembly method of an image sensor module assembly device, the method comprising:

- setting an image sensor and a module lens of an image sensor module at a first position;
- inputting image data to the image sensor module set at the first position;
- pre-processing data that are output from the image sensor module based on sensing the input image data;
- obtaining, based on the pre-processed data, a module optical system reference value of the module lens and a sensor optical system reference value of the image sensor; and
- determining whether to maintain the first position based on the module optical system reference value and the sensor optical system reference value,
- wherein the obtaining the sensor optical system reference value comprises:
- separating pixel values of unit pixels of the pre-processed data according to color channels;
- obtaining, for each color channel, a sample gain for each pixel included in a unit pixel of a corresponding color channel based on pixel values and a pixel average value of the unit pixel; and
- obtaining the sensor optical system reference value based on the sample gain for each pixel included in the unit pixel.

2. The assembly method of claim 1, further comprising:

- adjusting the first position to a second position, based on a determination that at least one of the module optical system reference value and the sensor optical system reference value does not belong to a corresponding preset threshold range;
- inputting the image data to the image sensor module that is set at the second position; and
- obtaining and comparing each of a new module optical system reference value and a new sensor optical system reference value with the corresponding preset threshold range.

3. The assembly method of claim 1, wherein the image data includes unit pixels, each unit pixel having an N×N (N is an integer of 2 or more) array pattern, and

- wherein the pre-processing of the data includes:
- obtaining a pixel average value of same color sub-pixels belonging to the unit pixel; and
- outputting the pre-processed data including pre-processed unit pixels of a 2×2 array pattern to which the pixel average value is mapped for each color.

4. The assembly method of claim 1,

- wherein the image data includes unit pixels, each unit pixel having an N×N (N is an integer of 2 or more) array pattern, and
- wherein the pre-processing of the data includes:
- obtaining a pseudo color value for all color sub-pixels belonging to the unit pixel; and
- outputting the pre-processed data including pre-processed unit pixels to which the pseudo color value is mapped.

5. The assembly method of claim 1, wherein the pre-processed data is obtained by adjusting a size of the output data of the image sensor module at a preset ratio or cropping a partial region of the output data.

6. The assembly method of claim 1, wherein the module optical system reference value includes at least one of a value of an optical axis, a lens shading value, and an image asymmetry value of the pre-processed data.

7. The assembly method of claim 6, wherein the module optical system reference value is obtained based on the pre-processed data to which a preset gain is applied.

8. The assembly method of claim 1, wherein the obtaining the sensor optical system reference value further comprises:

obtaining, for each color channel, a monitoring value from the pixel values of the unit pixel of the corresponding color channel.

9. The assembly method of claim 8, wherein the monitoring value for a color channel includes at least one of a pixel average value, a pixel minimum value, a pixel maximum value, a sensitivity difference between adjacent pixels, an absolute value of the sensitivity difference, or a gradient value between adjacent pixels included in a unit pixel of the color channel.

10. The assembly method of claim 8, wherein the obtaining the sensor optical system reference value further comprises:

obtaining an analysis value for each color channel from a sample gain image, generated by the sample gain for each pixel, and the monitoring value.

11. The assembly method of claim 10, wherein the determining whether to maintain the first position includes:

determining to maintain the first position based on the analysis value for each color channel being within a preset sensor optical system threshold range.

12. An image sensor module assembly device comprising:

a device setting unit configured to assemble an image sensor module by setting an image sensor and a module lens at a first position and mounting the image sensor and the module lens, set at the first position, to a module body; and a test module configured to:

input image data to the image sensor module;

pre-process the data that are output from the image sensor module based on sensing the input image data;

obtain, based on the pre-processed data, a module optical system reference value and a sensor optical system reference value; and determine whether to maintain the first position based on comparing each of the module optical system reference value and the sensor optical system reference value with a corresponding preset threshold range, wherein the test module is configured to obtain the sensor optical system reference value by:

separating pixel values of unit pixels of the pre-processed data according to color channels;

obtaining, for each color channel, a sample gain for each pixel included in a unit pixel of a corresponding color channel based on pixel values and a pixel average value of the unit pixel; and obtaining the sensor optical system reference value based on the sample gain for each pixel included in the unit pixel.

13. The image sensor module assembly device of claim 12, wherein the test module is configured to:

obtain, based on the pre-processed data, the module optical system reference value related to the module lens and the sensor optical system reference value related to the image sensor.

14. The image sensor module assembly device of claim 13, wherein the image data includes unit pixels, each unit pixel having an N×N (N is an integer of 2 or more) array pattern, and wherein the test module is configured to pre-process the data by:

obtaining a pixel average value of same color sub-pixels belonging to the unit pixel; and outputting the pre-processed data including pre-processed unit pixels of a 2×2 array pattern to which the pixel average value is mapped for each color.

15. The image sensor module assembly device of claim 13, wherein the test module is configured to pre-process the data by adjusting a size of the output data at a preset ratio or cropping a partial region of the output data.

16. The image sensor module assembly device of claim 13, wherein the module optical system reference value includes at least one of a value of an optical axis, a lens shading value, or an image asymmetry value, obtained from the pre-processed data.

17. The image sensor module assembly device of claim 13, wherein the test module is configured to obtain the sensor optical system reference value by using at least one of a pixel average value for each color channel, a pixel minimum value for each color channel, a pixel maximum value for each color channel, a sensitivity difference between adjacent pixels for each color channel, an absolute value of the sensitivity difference, or a gradient value between adjacent pixel values included in a unit pixel of a color channel, obtained from the pre-processed data.

18. An image sensor module assembly device, comprising:

at least one processor configured to:

set an image sensor and a module lens at a first position and control to mount the image sensor and the module lens to a module body to firstly assemble an image sensor module;

input image data to the firstly assembled image sensor module;

pre-process data that are output from the image sensor module based on sensing the input image data;

obtain, based on the pre-processed data, a module optical system reference value and a sensor optical system reference value;

compare each of the module optical system reference value and the sensor optical system reference value with a corresponding preset threshold range; and set the image sensor and the module lens at a second position to secondly assemble the image sensor module depending on a comparison result, wherein the at least one processor is configured to obtain the sensor optical system reference value by:

separating pixel values of unit pixels of the pre-processed data according to color channels;

obtaining, for each color channel, a sample gain for each pixel included in a unit pixel of a corresponding color channel based on pixel values and a pixel average value of the unit pixel; and obtaining the sensor optical system reference value based on the sample gain for each pixel included in the unit pixel.

19. The image sensor module assembly device of claim 18, wherein the module optical system reference value includes at least one of a value of an optical axis, a lens shading value, or an image asymmetry (tilt) value obtained from the pre-processed data.

20. The image sensor module assembly device of claim 18, wherein the at least one processor is configured to obtain the sensor optical system reference value by using at least one of a pixel average value for each color channel, a pixel minimum value for each color channel, a pixel maximum value for each color channel, a sensitivity difference between adjacent pixels for each color channel, an absolute value of the sensitivity difference, or a gradient value between adjacent pixel values included in a unit pixel of a color channel, obtained from the pre-processed data.

* * * * *